United States Patent [19]

Aruga

[11] Patent Number: 5,779,848
[45] Date of Patent: Jul. 14, 1998

[54] CORROSION-RESISTANT ALUMINUM NITRIDE COATING FOR A SEMICONDUCTOR CHAMBER WINDOW

[75] Inventor: Michio Aruga, Inba-gun, Japan

[73] Assignee: Applied Materials, Inc., Santa Clara, Calif.

[21] Appl. No.: 781,473

[22] Filed: Jan. 10, 1997

[30] Foreign Application Priority Data

Jan. 10, 1996 [JP] Japan ................... 8-002260

[51] Int. Cl.⁶ .............................................. H01L 21/00
[52] U.S. Cl. ................... 156/345; 118/723 R; 216/67
[58] Field of Search ................ 156/345 V, 345 LT, 156/345 P; 216/66, 67, 79; 438/724, 744; 204/298.31, 298.36; 118/723 R

[56] References Cited

U.S. PATENT DOCUMENTS 5,443,686  8/1995  Jones et al. .................. 156/345 X
5,650,013  7/1997  Yamazaki .................... 156/345 X
5,680,013  10/1997  Dornfest et al. ............. 118/723 R

*Primary Examiner*—William Powell
*Attorney, Agent, or Firm*—Donald Verplancken; Raymond R. Moser, Jr.; Robert W. Mulcahy

[57] ABSTRACT

An improved integrated circuit processing apparatus is disclosed wherein a protective coating of aluminum nitride (AlN), on the inner surface of a quartz ($SiO_2$) window in the wall of the integrated circuit processing apparatus provides an enhanced resistance to the corrosive effects of halogen-containing reagents, particularly fluorine-containing gases, on the protected inner surface of the quartz window. Formation of an AlN coating having a minimum thickness of about 1 micron up to a maximum thickness of about 15 microns with a coating uniformity of ±15% of the average coating thickness, provides the desired protection of the inner surface of the quartz window from corrosive attack by fluorine-containing gases, such as $NF_3$, $SF_6$, and fluorine-containing hydrocarbons, e.g., $C_2F_6$.

18 Claims, 4 Drawing Sheets

CORROSION-RESISTANT ALUMINUM NITRIDE COATING FOR A SEMICONDUCTOR CHAMBER WINDOW

BACKGROUND OF THE INVENTION

1. Field of the Invention

The present invention relates to processing apparatus for the fabrication of integrated circuit structures on semiconductor substrates. More particularly, this invention relates to a semiconductor processing apparatus having a quartz window therein formed with a protective coating on its inner surface to protect the window from corrosive attack of processing reagents used within the processing apparatus, particularly fluorine-containing gases.

2. Description of the Prior Art

In apparatus for the plasma processing of integrated circuit structures on semiconductor wafers, it is common to heat the wafer in a processing chamber, such as a vacuum chamber, using infrared heating sources external to the chamber. One or more optically transparent materials, such as quartz windows, are then provided in the walls of the chamber through which the heat rays from the external heating source penetrate into the chamber to heat the wafer. Typical semiconductor plasma processing apparatus include gas-phase precipitation (chemical vapor deposition) or etch processing equipment. It is also common to provide optically transparent windows in semiconductor plasma processing chambers used for the formation of wafers to optically monitor the temperature of the wafer and/or other internal portions of the chamber using an optical pyrometer.

In either case of chemical vapor deposition (CVD) or etch processing, such windows are usually formed of quartz ($SiO_2$) because of its combined optical transparency and chemical resistance to attack by the reagents used in such processing apparatus. However, even quartz does not stand up well to the corrosive attack of halogen-containing reagents, especially fluorine-containing gases, which may be used in the processing of the semiconductor wafer. Such fluorine-containing gases, such as $NF_3$; $SF_6$; and fluorinated hydrocarbon gases, such as $CF_4$, $CHF_3$, $CH_2F_2$, $CH_3F$, $C_2F_6$, etc., may be used in carrying out etching processes, while other fluorine-containing gases, such as $WF_6$, may be used for tungsten deposition, and still other fluorine-containing gases, such as the aforementioned $NF_3$ and $C_2F_6$ gases, may be used as cleaning gases following CVD deposition processes, such as, for example, TEOS, nitride, or tungsten depositions.

When such quartz windows are regularly exposed to such fluorine-containing gases, the quartz window will last for from about 9000 to about 11,000 wafers, or about 3 months, before it must be replaced due, for example, to $NF_3$ corrosion. However, while such replacement may be due to loss of opacity of the window to transmit the heat from the external heating lamps, or due to the inability of the window to properly permit optical monitoring of the heat, particle generation due to such corrosive effects may occur much sooner. In fact, particles generated from corrosion of the quartz window by $NF_3$ can be observed after the processing of as few as 500 wafers in the chamber. Therefore, in addition to the life of the window becoming short and the transmissivity of the window decreasing, degraded quartz peels off from the windows, generates fine particles within the process chamber, and creates a problem of contaminating the manufactured semiconductor substrate device. Such particle generation is highly undesirable in the processing of integrated circuit structures due to the detrimental effects of such particle generation on the yield of integrated circuit chips per wafer.

In order to remedy these problems of opacity and particle generation, the inside surface of the chamber quartz window is generally coated with a material comprised of sapphire or $Al_2O_3$, which coatings render a window of favorable transmissivity and superior durability, with respect to the generation of fluorine and chlorine plasmas in the chamber. In order to obtain the necessary durability with respect to the plasma, the sapphire or $Al_2O_3$ coatings must be relatively thick, in the order of about 6–10 microns. However, cracks in these relatively thick quartz window coatings can still occur easily and, while these coated windows provide significantly improved use life of the quartz window, the problems of fine particle generation and extended window life still remain.

Therefore, it is highly desirable to provide an improved chemically corrosion-resistant surface on such a quartz window in an integrated circuit processing apparatus which would be resistant to attack by halogen-containing reagents, particularly fluorine-containing gases, which come in contact with the inner surface of the window.

SUMMARY OF THE INVENTION

The present invention addresses the above-cited problems and provides a semiconductor plasma processing apparatus which has a long life and minimal generation of fine particle contaminants in a high corrosivity environment of halogen gas plasmas. It has been found that a protective coating of aluminum nitride (AlN) on the inner surface of a quartz ($SiO_2$) window in an integrated circuit processing apparatus provides an enhanced resistance to the corrosive effects of fluorine-containing reagents on the protected quartz window surface. Formation of an AlN coating having a thickness of from about 1–15 microns, preferably from about 1–10 microns, and most preferably about 1–5 microns, provides the desired protection of the inner surface of the quartz ($SiO_2$) window from corrosive attack by fluorine-containing reagents, such as $NF_3$, $SF_6$, and fluorine-containing hydrocarbons, e.g., $C_2F_6$.

Provided herein is a plasma processing chamber having a window panel substrate and an aluminum nitride coating layer formed thereon, said surface facing the interior of said process chamber. The window panel substrate is comprised of quartz, and the thickness of the aluminum nitride coating layer is from about 1–15 microns, said coating being applied by a reactive sputtering method. The chamber window of the present invention can be employed in a plasma etching or a CVD apparatus.

Additionally provided herein is a process chamber window used for installation in the wall of a semiconductor process chamber to transmit light emitted from the outside to the inside of said process chamber, said chamber window comprising: (a) a substrate; and (b) a layer of aluminum nitride coated on the surface of the substrate to be placed within the interior of the process chamber.

Prior art sapphire and $Al_2O_3$ plasma chamber window coatings must be formed with a thickness of 6–10 mm (or more) in order to obtain sufficient durability with respect to corrosive attack of halogen plasma processing environments. In the case of the instant aluminum nitride plasma processing chamber window coatings, relatively thin coatings in the range of from about 1–5 microns are found to be effective in terms of durability and transmissivity, even in the case of highly corrosive etch processing. The aluminum nitride coatings of the present invention can be formed easily on a window substrate surface, such as quartz, etc., by means of reactive sputtering.

DETAILED DESCRIPTION OF THE INVENTION

The invention comprises an improved apparatus for the processing of integrated circuit structures on semiconductor wafers wherein the inner surface of one or more quartz ($SiO_2$) windows in the processing chamber is provided with a corrosion-resistant protective coating of AlN thereon which is particularly resistant to the corrosive effects of halogen-containing reagents, particularly fluorine-containing gases, used in the processing chamber.

The present invention is based on the discovery that the greatest cause of cracks in prior art plasma chamber windows coated with sapphire or $Al_2O_3$ films is due to the difference in the thermal expansion coefficient of the film coating and the thermal expansion coefficient for the quartz, rather than the corrosive effect of plasma. More precisely, the temperature rises in the chamber as the generated plasma progresses and, consequently, with the rising temperature both the film coating layer and the window quartz substrate (having different thermal expansion coefficients) undergo differential tensile and compressive stresses, thereby generating cracks. Therefore, the inventor focused on the thermal expansion coefficient in the cover material; performed tests; executed trial manufacturing; and achieved the necessary objective using aluminum nitride.

Aluminum nitride has been found to be an optimum material for coating quartz windows for use in plasma processing chambers. Aluminum nitride has a linear expansion coefficient value closer to quartz than to sapphire ($Al_2O_3$), leading to an expectancy of relatively compatible thermal expansion. Therefore, when the temperature rises due to plasma generated in the chamber, the film layer comprised of aluminum nitride does not undergo the high stress with the quartz window substrate that would otherwise be expected when using another film coating having a greater linear expansion differential with the quartz panel substrate. Additionally, aluminum nitride has high physical and thermal durability. The thermal conductivity of aluminum nitride is high compared to sapphire and, consequently, it is not heated excessively due to the transmission of light from the heating lamp. Therefore, durability of the AlN film with respect to thermal shock (thermal shock resistance) is favorable. Moreover, aluminum nitride possesses an improved chemical corrosion resistance with respect to halogen plasmas, particularly fluorine plasma, compared to a quartz window coating comprised of sapphire or $Al_2O_3$.

Figure 1:
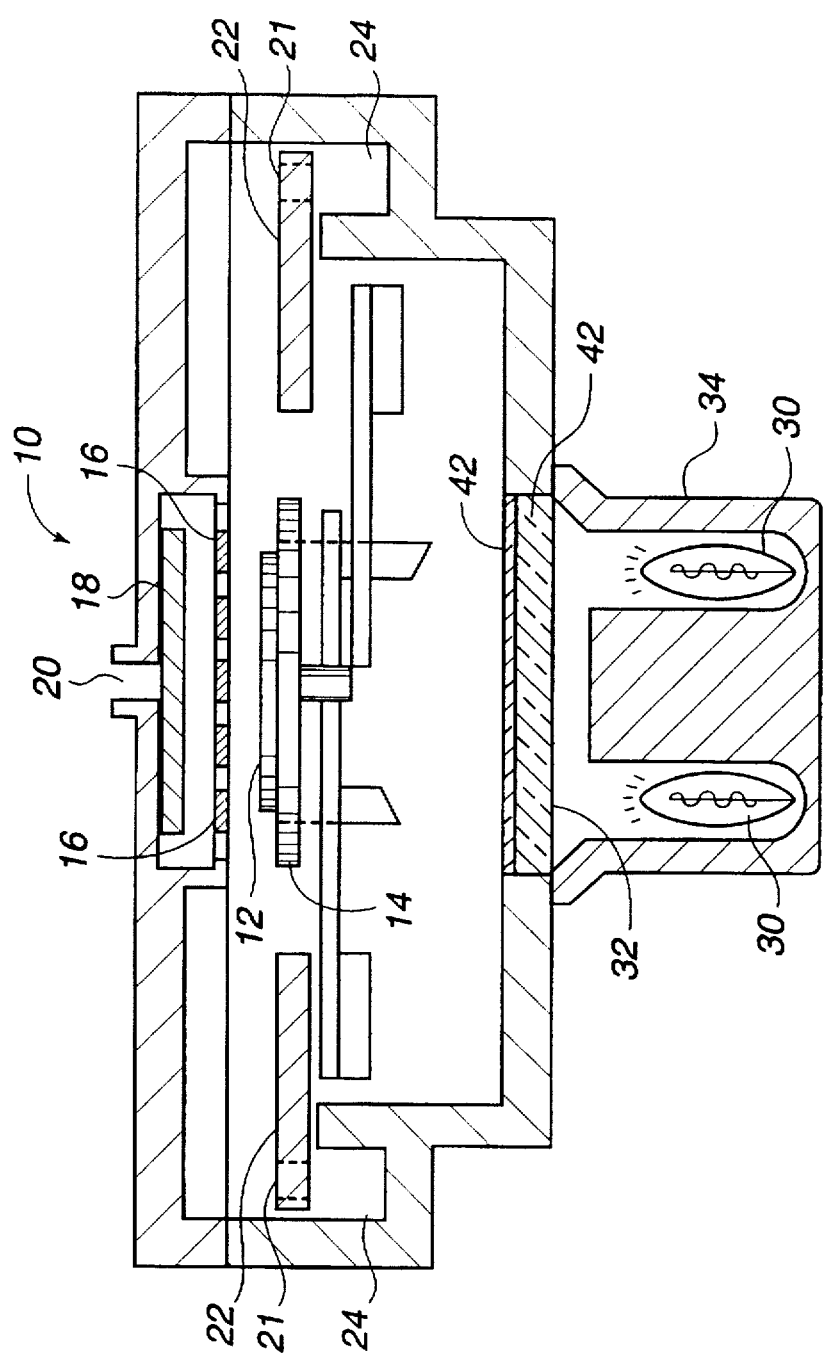
FIG. 1 is a schematic diagram of a plasma etch semiconductor process chamber.

The improved integrated circuit structure processing apparatus of the invention is shown in FIG. 1, which depicts the interior of plasma etching chamber 10 which incorporates a coated transmissive window in accordance with the present invention. Reactor chamber 10 contains a highly thermally responsive susceptor 14 made of aluminum which supports wafer 12. Showerhead-type gas dispersion plate 16 is arranged above the wafer and, above that, gas inflow manifold 18 and gas inflow port 20 are positioned. Gas inflow port 20 can be connected to two types of gas lines as, for example, a $SiH_4$ line and a $WF_6$ line systems. Gas flowing into etching chamber 10 from said gas inflow port 20 is dispersed and diffused by gas inflow manifold 18 and flows in the direction of gas dispersion plate 16, and is further dispersed and diffused again by gas dispersion plate 16 before reaching wafer 12. Susceptor 14 and gas inflow manifold 18 are electrodes connected to the RF power source. Halogen-containing gas (e.g., fluorine or chlorine-containing gas) reaches wafer 12 from gas inflow port 20 via gas inflow manifold 18 and gas dispersion plate 16. If RF power is applied to the space above the wafer, a fluorine (or chlorine) plasma is generated, etching wafer 12. Thereafter, gas passes through aperture 21 of baffle plate 22, reaches vacuum manifold 24, and is discharged to the outside of plasma etching chamber 10. A heating lamp 30 is arranged below plasma etching chamber 10, which lamp transmits light through quartz window 32 to the source, thermally responsive susceptor 14, thereby heating it.

Figure 2A:
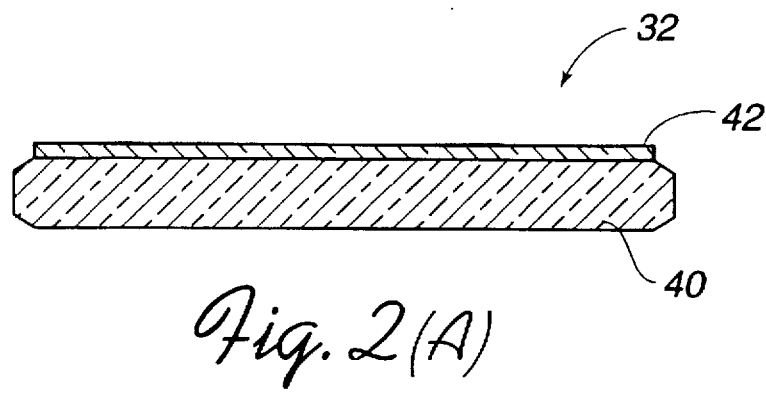
FIG. 2 is a cross-section view of the plasma chamber coated window of the invention.
Figure 2B:
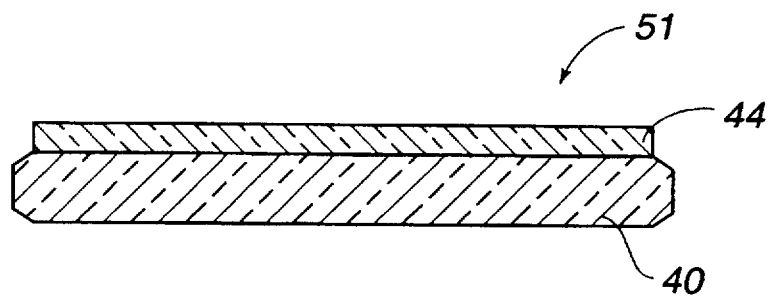

FIG. 2 is a cross section of two different coated quartz windows: FIG. 2a is a coated window 32 comprised of a quartz substrate 40 covered with a thin film of AlN, in accordance with the present invention; and FIG. 2b is a sapphire-covered window 321 used conventionally. In FIG. 2, the dimensions are exaggerated to illustrate the dimensional advantages of the instant film coating. As shown in FIG. 2a, coated window 32 of the present invention is comprised of window substrate 40, consisting of quartz material, and, on one surface of window substrate 40 a thin layer of AlN 42 of AlN having a thickness of at least 1 mm. The AlN layer 42 was formed by a reactive sputtering technique using nitrogen for the reaction gas and Al for the target. On the other hand, as shown in FIG. 2b, window 51 used conventionally is formed on window substrate 40, composed of quartz, with a sapphire layer generally having a thickness of at least 6 mm. When using these windows 32 and 51 in a CVD or plasma etch process chamber, AlN layer 42 or sapphire layer 44 is arranged on the chamber wall so as to be inside the process chamber and thereby becomes an integral part of the chamber wall.

In FIG. 2a, a thin coating layer 42 of AlN is shown formed on the inner surface of window 40 with the illustrated thickness of coating 42, relative to the thickness of window 40, shown exaggerated for illustrative purposes only, it being understood that the quartz window is much thicker (typically about 0.5") than the thin AlN coating deposited thereon.

The thickness of protective AlN coating film 42, however, must be sufficient to provide the desired protection of the underlying quartz window material from chemical attack from the reagents used within chamber 10 of FIG. 1. Protective AlN coating film 42 should, therefore, have a minimum average thickness of at least about 1 mm, to provide such protection.

The maximum thickness of protective AlN coating film 42 will be governed both by process economics and coating stress. The economics of the deposition process dictate that an excessive amount of AlN coating film not be used because of the slow deposition rate (of from about 0.2 to about 0.4 microns/hour) which is used to ensure deposition of a uniform and adherent coating film on the quartz window surface. From a mechanical standpoint, thicker coatings create both internal stress within the coating, as well as thermal stress with respect to the SiO$_2$ window itself, as the AlN-coated quartz window is heated to the operating temperature of the apparatus, which may, for example, range from about 200° C. to about 700° C. Therefore, the average maximum thickness of the deposited AlN coating film on the quartz window should not exceed about 15 microns and, preferably, should not exceed about 10 microns. Furthermore, to ensure uniform protection of the quartz window, the coating thickness uniformity should be ±15%. That is, the thickness of the coating film at any point on the quartz window should not be more than 15% thinner or thicker than the average thickness of the AlN-coated film.

To form a uniform and adherent AlN coating film on the surface of the quartz window, the window surface is first optically polished on both sides, with the side to be coated free of any visible open bubbles and polished to a 40–20 or better polished surface, as defined in section 3.5 of Military Specification MIL-O-13830A. After the polishing step, the polished quartz window is then cleaned using a 5 wt. % HF solution into which the polished quartz window is dipped for from about 10 to about 30 seconds. After such cleaning, the polished window is rinsed in deionized water and allowed to dry.

After cleaning and drying, the polished quartz window is placed in an ion beam deposition chamber and aluminum is sputtered from an aluminum target onto the 40–20 polished surface of the quartz window with an ion beam while maintaining a nitrogen atmosphere in the chamber so that the sputtered aluminum is immediately nitrogenated to form the desired AlN coating as it deposits on the quartz window. The ion beam sputter deposition process is carried out until the desired AlN coating thickness is deposited.

Figure 3:
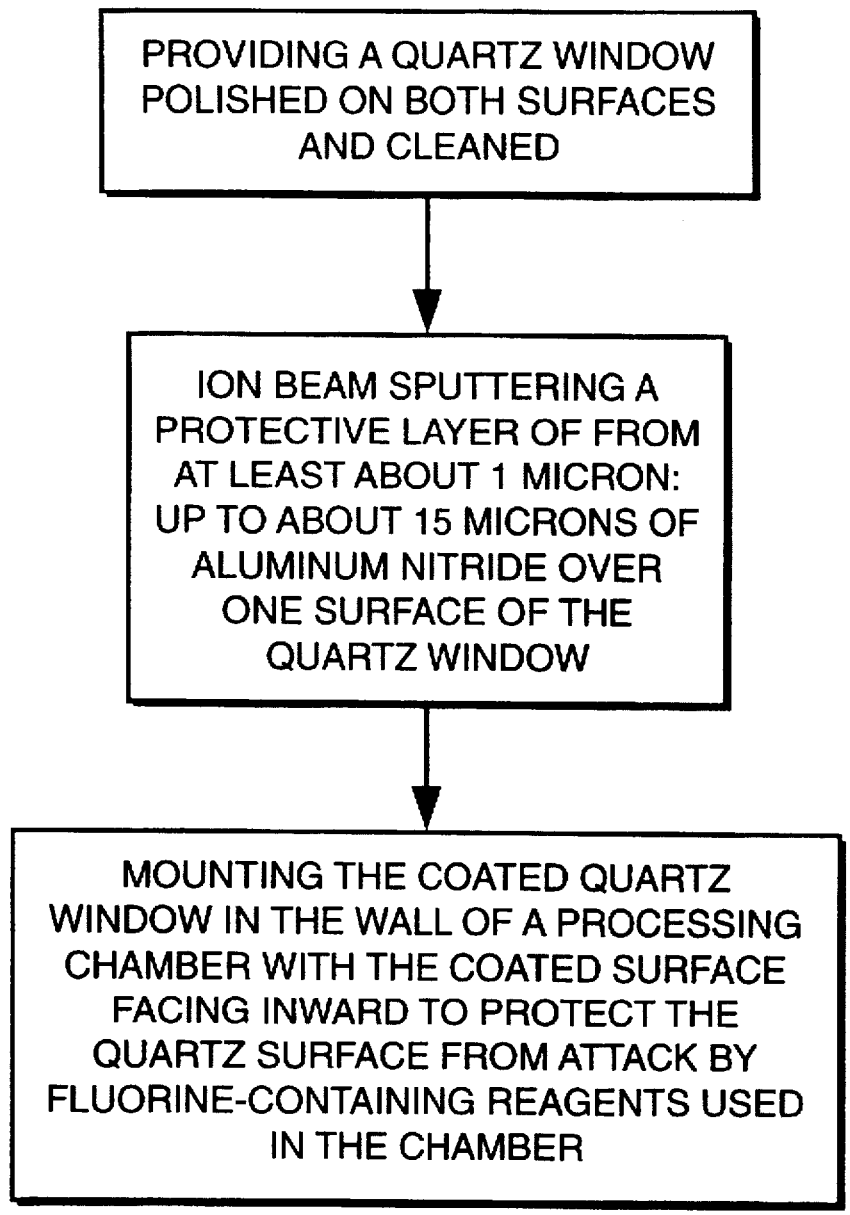
FIG. 3 is a flow sheet illustrating formation of the instant plasma chamber window with the protective coating thereon.
Figure 4:
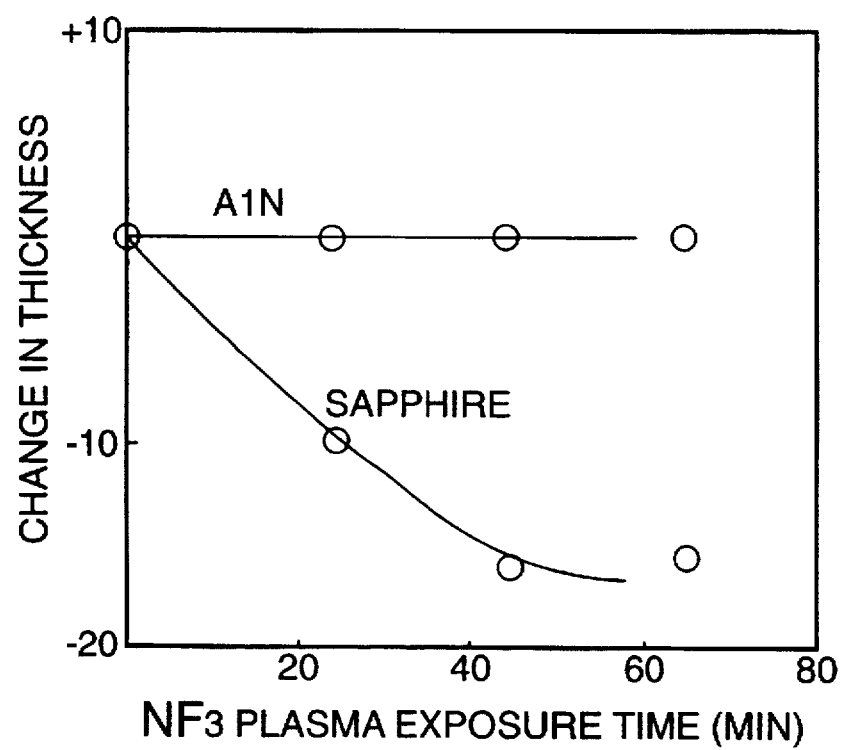
FIG. 4 is a graph showing the comparative corrosive effects of etch processing of the coated chamber windows of the prior art and that of the present invention.

The process for the reactive sputtering preparation of the instant aluminum nitride coated window is outlined in the flow diagram of FIG. 3, said process comprising: (a) providing a quartz window substrate; (b) ion beam sputtering a protective layer of from at least about 1–15 microns of aluminum nitride over one surface of the quartz substrate; and (c) mounting the coated quartz window in the wall of the plasma processing chamber with the coated surface facing inward to protect the quartz surface from attack by halogen gases used in the chamber.

The coated quartz window may then be removed from the deposition chamber and the deposited AlN coating visually examined for pinholes. If none are found, the coated quartz window may be mounted in the wall of the integrated circuit processing apparatus, with the coated surface facing inwardly, where the AlN coating will serve to protect the surface of the quartz window from corrosive attack by the chemical reagents, particularly fluorine-containing reagents, used in the processing of integrated circuit structures on semiconductor wafers.

The window coating of the present invention can be modified. For example, it is possible to adjust the thermal conductivity and linear expansion coefficient, etc., for AlN, by changing the purity and the compositional structure of the AlN by manipulating the sputtering energy and flow rate of the nitrogen gas in the preparation of the AlN layer.

The thermal conductivity and linear expansion coefficient for AlN is shown in Table I below, along with the conventionally-used aluminum sapphire.

TABLE I

| | Linear Expansion Coefficient (1/°C.) | Thermal Conductivity (W/m · K.) |
|---|---|---|
| Quartz (SiO$_2$) | $0.56 \times 10^{-6}$ | 0.2 |
| Sapphire (3NAl$_2$O$_3$) | $8.7 \times 10^{-6}$ | 33 |
| Aluminum Nitride (AlN) | $4.3 \times 10^{-6}$ | 170 |

As can be appreciated from Table I, the difference in the coefficient of linear expansion between quartz and aluminum nitride is about one-half the difference in the linear expansion coefficient between quartz and sapphire. Therefore, it is apparent that the stress generated at the interface of the quartz substrate 40 and the film coatings 42 and 44 of FIG. 2, due to the difference in the linear expansion coefficient during severe fluctuations in temperature due to natural cooling and heating, is less in the case of the AlN laminate (FIG. 2a) than that thermal stress generated in the sapphire/quartz laminate (FIG. 2b).

Additionally, with regard to the thermal conductivity, AlN is more than five times that of sapphire, as shown in Table I. Therefore, it is apparent that the durability is more favorable in an AlN-coated window than that of a sapphire-coated window in terms of thermal shock generated by alternate cycles of heating and heat radiation.

In order to check the resistance to plasma etching of the AlN-coated windows according to the present invention, an accelerated test was conducted under more severe conditions than those for actual window use.

An example of the present invention is explained below with reference to the figures. In the figures, the same numerals will be applied with respect to the same elements. In the present example, a plasma etching apparatus was used; the use of a window covered with aluminum nitride (AlN) and the use of a window covered with Al$_2$O$_3$ in a plasma etching chamber were compared; and the extent of corrosion in the respective coatings was measured after continuous plasma etching of each coated window.

As an accelerated test, plasma generation and exposure of each of the coated windows was executed for about 65 minutes by arranging the coated surface of the window above the susceptor of a plasma etching chamber so as to expose the surface coating to the plasma. The space above the susceptor (in FIG. 1, the space between susceptor 14 and gas dispersion plate 16) is the plasma region formed by the plasma, and etching of the window is direct, thereby accelerating etching of the exposed coated surface, and is high compared to that etching of the coating that would occur at the window position at the lower portion of the plasma region. Therefore, by executing direct etching of the windows by arranging them above the susceptor, it becomes an effective accelerated test for evaluating the plasma etching resistance of each window.

The conditions in this accelerated test were as follows:

Chemical type used: NF$_3$

NF$_3$ flow rate: 100 sccm

RF output: 300 W

Susceptor temperature 475° C.

Chamber internal pressure: 200 mTorr

Size of window test piece: 25×30×5 (mm)

Under these conditions, the window coated with AlN, as shown in FIG. 2a, and the window covered with sapphire, as shown in FIG. 2b, were exposed to plasma and the change in the thickness of the window over time was measured. The results are shown in FIG. 3, which graphically demonstrates a dramatic thickness decrease in lapse time of NF₃ plasma exposure for approximately 65 minutes in the sapphire-coated window, whereas the AlN-coated window of the present invention showed high durability in remaining relatively thickness-constant during the period of plasma etch exposure.

As explained in detail above, the process chamber window of the present invention has a coated layer of aluminum nitride on the inner surface of the window corresponding to that surface facing the interior of the process chamber, so that corrosive peeling due to the difference in thermal expansion of the quartz substrate is less likely, and high durability with regard to thermal shock due to low thermal conductivity is exhibited.

Therefore, it is possible to realize a plasma treatment device with a long life and with minimal generation of undesirable particulate contaminants.

What is claimed is:

1. An improved apparatus for the processing of integrated circuit structures on semiconductor wafers wherein the improvement comprises a protective coating of AlN formed on the inner surface of a quartz window mounted in a wall of said apparatus.

2. The improved apparatus of claim 1 wherein said protective coating of AlN on said inner surface of said quartz window has a thickness range of from about 1 to 15 microns.

3. The improved apparatus of claim 1 wherein said protective coating of AlN on said inner surface of said quartz window has a thickness range of from about 1 to 10 microns.

4. The improved apparatus of claim 1 wherein said protective coating of AlN on said inner surface of said quartz window has a thickness ranging from at least about 1 to 5 microns.

5. The improved apparatus of claim 1 wherein said protective coating of AlN on said inner surface of said quartz window has a coating uniformity of ±15% of the average coating thickness.

6. In an apparatus for the processing of integrated circuit structures on semiconductor wafers wherein one or more optically transparent quartz windows are mounted in the wall of a process chamber, the improvement which comprises a protective coating of from about 1 to about 15 microns of AlN formed on the inner surface of each of said one or more quartz windows to protect said one or more quartz windows from corrosive attack by fluorine-containing reagents used in said chamber.

7. The improved apparatus of claim 6 wherein said protective coating of AlN on said inner surface of said one or more quartz windows has a coating uniformity of ±15% of the average coating thickness.

8. The improved apparatus of claim 7 wherein said protective coating of AlN on said inner surface of said one or more quartz windows has a thickness ranging from at least about 1 micron up to about 10 microns.

9. The improved apparatus of claim 7 wherein said protective coating of AlN on said inner surface of said one or more quartz windows has a thickness ranging from at least about 1 micron up to about 5 microns.

10. In an apparatus for the processing of integrated circuited structures on semiconductor wafers wherein one or more optically transparent quartz windows are mounted in the wall of a processing chamber to permit external heating of a semiconductor wafer within said chamber via one or more heat lamps located external to said chamber and adjacent to said windows, the improvement which comprises a protective coating of from about 1 to about 5 microns of AlN formed on the inner surface of each of said one or more quartz windows with a coating uniformity of ±15% of the average coating thickness to protect said one or more quartz windows from corrosive attack by fluorine-containing reagents used in said chamber.

11. A process chamber window used for installation in the wall of a semiconductor process chamber to transmit light emitted from the outside of said process chamber, said chamber window comprising:

a) a substrate; and b) a layer of aluminum nitride coated on that surface of the substrate to be placed within the interior to the process chamber.

12. The process chamber window of claim 11, in which the window substrate is comprised of quartz.

13. The process chamber window of claim 11, in which the thickness of the aluminum nitride coating layer is from about 1 to 15 microns.

14. The process chamber window of claim 11, in which the thickness of the aluminum nitride coating layer is from about 1 to 10 microns.

15. The process chamber window of claim 11, in which the thickness of the aluminum nitride coating layer is from about 1 to 5 microns.

16. The process chamber window of claim 12, in which the coating layer is formed on said surface by a reactive sputtering method comprising:

a) providing a quartz window substrate;

b) ion beam sputtering a protective layer at from at least about 1–15 microns of aluminum nitride over one surface of the quartz substrate; and c) mounting the coated quartz window in the wall of a plasma processing chamber with the coated surface facing inward to protect the quartz surface from attack by halogen gases used in the chamber.

17. The process chamber window of claim 12 in which the process chamber is an etch apparatus.

18. The process chamber window of claim 12, in which the process chamber is a CVD apparatus.

* * * * *